(12) United States Patent
Loiler et al.

(10) Patent No.: US 7,486,519 B2
(45) Date of Patent: Feb. 3, 2009

(54) SYSTEM FOR COOLING A HEAT-GENERATING ELECTRONIC DEVICE WITH INCREASED AIR FLOW

(75) Inventors: Brian Roger Loiler, Soquel, CA (US); Xiaohua H. Sun, Cupertino, CA (US)

(73) Assignee: NVIDIA Corporation, Santa Clara, CA (US)

( * ) Notice: Subject to any disclaimer, the term of this patent is extended or adjusted under 35 U.S.C. 154(b) by 56 days.

(21) Appl. No.: 11/361,870

(22) Filed: Feb. 24, 2006

(65) Prior Publication Data
US 2007/0201211 A1 Aug. 30, 2007

(51) Int. Cl.
*H05K 7/20* (2006.01)
*H01L 23/36* (2006.01)

(52) U.S. Cl. .............. 361/720; 361/695; 361/715; 361/719; 165/80.3; 165/121; 165/122

(58) Field of Classification Search ......... 361/687–697, 361/700–717, 719, 720; 257/706–727; 165/80.3, 165/185, 104.33, 104.34, 121–126; 174/16.1, 174/16.3, 252.1; 454/184; 415/175–178, 415/201–206; 62/259.2
See application file for complete search history.

(56) References Cited

U.S. PATENT DOCUMENTS

| | | | | |
|---|---|---|---|---|
| 6,348,748 B1 * | 2/2002 | Yamamoto | ................... | 310/62 |
| 6,472,781 B2 * | 10/2002 | Yamamoto | ................... | 310/58 |
| 6,643,129 B2 * | 11/2003 | Fujiwara | .................... | 361/687 |
| 6,665,181 B2 * | 12/2003 | Tanaka et al. | ............... | 361/695 |
| 6,681,845 B1 * | 1/2004 | Yeh et al. | .................... | 165/122 |
| 6,778,391 B2 * | 8/2004 | Inoue | ......................... | 361/695 |
| 6,781,835 B2 * | 8/2004 | Hashimoto et al. | .......... | 361/697 |
| 6,847,524 B2 * | 1/2005 | Tomioka et al. | ............. | 361/695 |
| 7,044,720 B1 * | 5/2006 | Yamamoto et al. | ....... | 417/423.1 |
| 7,174,952 B1 * | 2/2007 | Hong et al. | ................. | 165/122 |
| 7,248,473 B2 * | 7/2007 | Ohnishi et al. | .............. | 361/695 |

* cited by examiner

*Primary Examiner*—Michael V Datskovskiy
(74) *Attorney, Agent, or Firm*—Patterson & Sheridan, LLP

(57) ABSTRACT

A system for cooling a heat-generating electronic device in a computer system includes a printed circuit board having one or more ventilation holes and coupled to a first side of the heat-generating electronic device, and a fan assembly having a top side and a bottom side and coupled to a second side of the heat-generating electronic device. The fan assembly is disposed relative to the printed circuit board to allow air to flow into the top side of the fan assembly and into the bottom side of the fan assembly through the one or more ventilation holes. One advantage of this design is that it enables a greater volume of air to flow through the fan assembly relative to prior art designs, thereby resulting in more efficient cooling of the heat-generating electronic device.

22 Claims, 6 Drawing Sheets

SYSTEM FOR COOLING A HEAT-GENERATING ELECTRONIC DEVICE WITH INCREASED AIR FLOW

BACKGROUND OF THE INVENTION

1. Field of the Invention

The present invention relates generally to computer hardware and more particularly to a system for cooling a heat-generating electronic device with increased air flow.

2. Description of the Related Art

In recent years, the number of transistors packed into processors and the clock speeds of these processors have dramatically increased. Consequently, today's processors generate greater amounts of heat that must be efficiently dissipated by a cooling system to prevent the processors from overheating during operation. FIG. 1 illustrates a prior art cooling system 100 for cooling a heat-generating electronic device in a computer system, such as a graphics processor (GPU). This type of cooling system is sometimes referred to as a "fansink." As shown, fansink 100 characteristically includes a fan 106, fins 109 and a bottom plate 111. Typically, fansink 100 is thermally coupled to the GPU, for example, using thermal adhesive or grease having thermal properties that facilitate transferring heat generated by the GPU to the bottom plate 111. Fansink 100 may also include a heat sink lid (not shown), which, among other things, prevents particles and other contaminants from entering fan 106 and air blown from fan 106 from escaping fansink 100. The heat sink lid, together with the fins 109 and the bottom plate 111, define a plurality of air channels 108.

Fan 106 is configured to force air through air channels 108 over bottom plate 111 such that the heat generated by the GPU transfers to the air. The heated air then exits heat sink assembly 104, as depicted by flow lines 114, thereby dissipating the heat generated by the GPU into the external environment. This process cools the GPU, preventing the device from overheating during operation. Persons skilled in the art will understand that air channels 108 typically are configured to direct air blown from fan 106 over bottom plate 111 and into the external environment in a manner that most efficiently removes heat from the GPU.

One drawback of this type of "fansink" cooling system is that air is able to enter the system only through the top part of the fan. Thus, the amount of air that can be forced through the air channels is limited, which retards the cooling efficiency of these types of cooling systems. Another related drawback is that the cooling efficiency limitations oftentimes render these types of cooling systems inadequate to meet the increased heat dissipation requirements of today's GPUs and other processors. Increasing the heat dissipation capabilities of these cooling systems requires design modifications such as employing a larger fan or utilizing multiple fans. However, the available space for cooling systems within computer systems is typically fixed or, in some cases, has been decreased. Thus, prior art fansink designs not only are sometimes unable to provide the necessary amount of cooling, in many cases, the designs cannot be scaled.

As the foregoing illustrates, what is needed in the art is a way to increase the cooling efficiency of fansink-type cooling systems that does not substantially increase the size or cost of these systems.

SUMMARY OF THE INVENTION

One embodiment of the present invention sets forth a system for cooling a heat-generating electronic device. The system includes a printed circuit board having one or more ventilation holes that is coupled to a first side of the heat-generating electronic device. The system also includes a fan assembly having a top side and a bottom side that is coupled to a second side of the heat-generating electronic device. The fan assembly is disposed relative to the printed circuit board to allow air to flow into the top side of the fan assembly and into the bottom side of the fan assembly through the one or more ventilation holes.

One advantage of the disclosed system is that it provides two inlet air flow paths through the fan assembly. The two flow paths enable a greater volume of air to be forced through the fan assembly, thereby increasing the cooling efficiency of the disclosed system relative to prior art cooling systems that provide only a single inlet air flow path.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
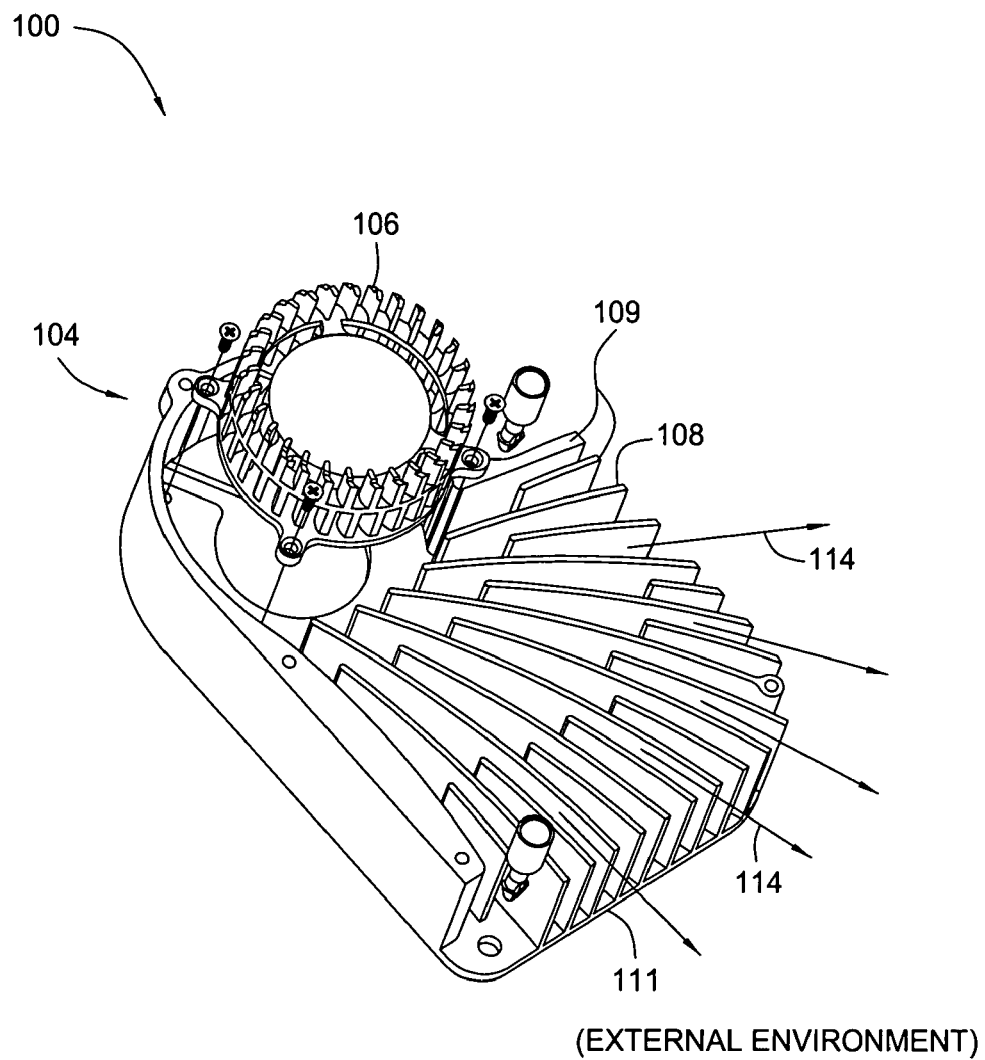
FIG. 1 is an isometric view of a prior art cooling system for cooling a heat-generating electronic device.
Figure 2:
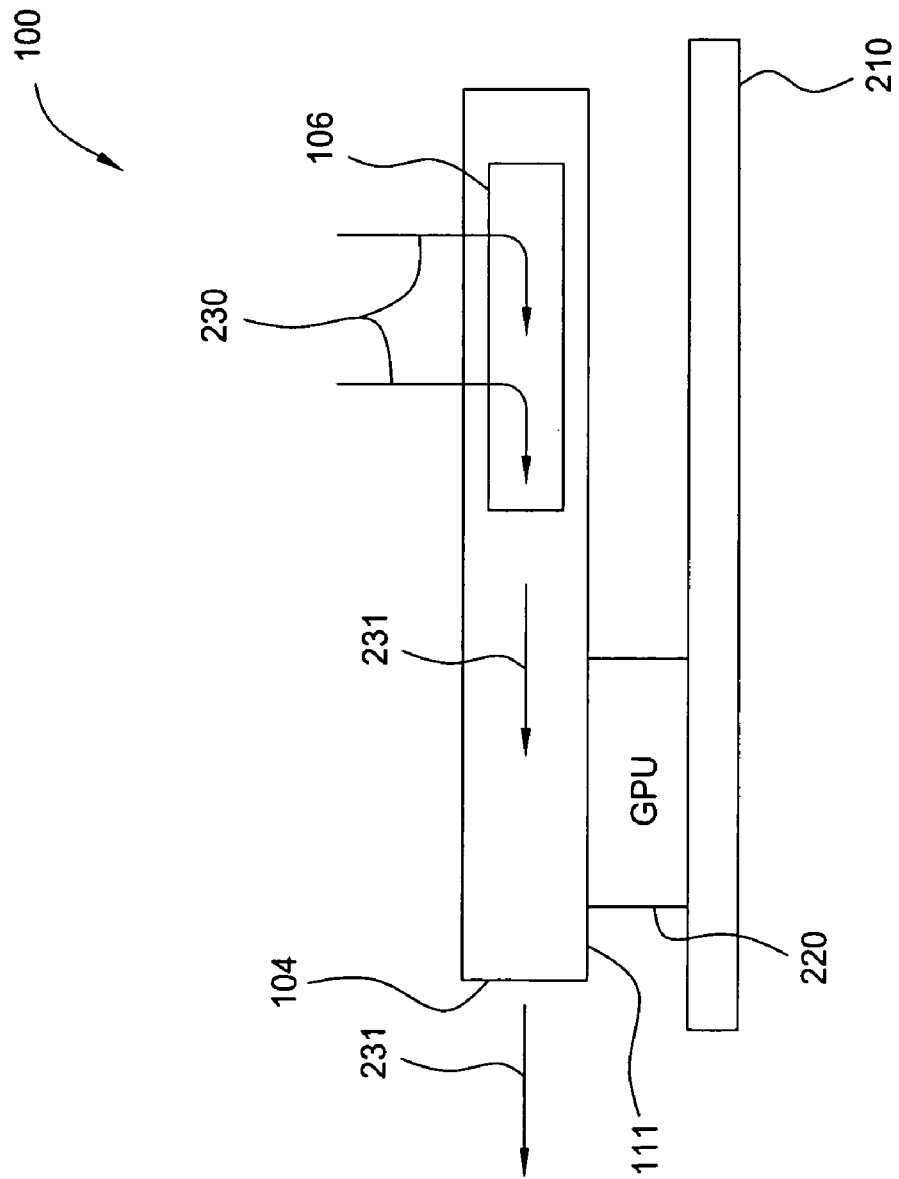
FIG. 2 is a side view of the cooling system of FIG. 1, depicting the single inlet air flow path through the cooling system during operation.

FIG. 2 illustrates a side view of cooling system 100 of FIG. 1, depicting the single inlet air flow path through cooling system 100 during operation. As shown, cooling system 100 is coupled to a GPU 220, which is mounted on a printed circuit board (PCB) 210. As is well-known, a graphics card typically includes PCB 210, GPU 220 as well as other electronic components also coupled to PCB 210. During operation, air enters cooling system 100 through the top part of fan 106, as indicated by an inlet air flow path 230. Fan 106 forces this air through the air channels (not shown) of heat sink assembly 104, as depicted by an air flow line 231. As previously described, the heat generated by GPU 220 transfers to the air as the air flows through air channels 108 and over bottom plate 111. The heated air is then dissipated into the external environment, thereby cooling GPU 220.

Figure 3A:
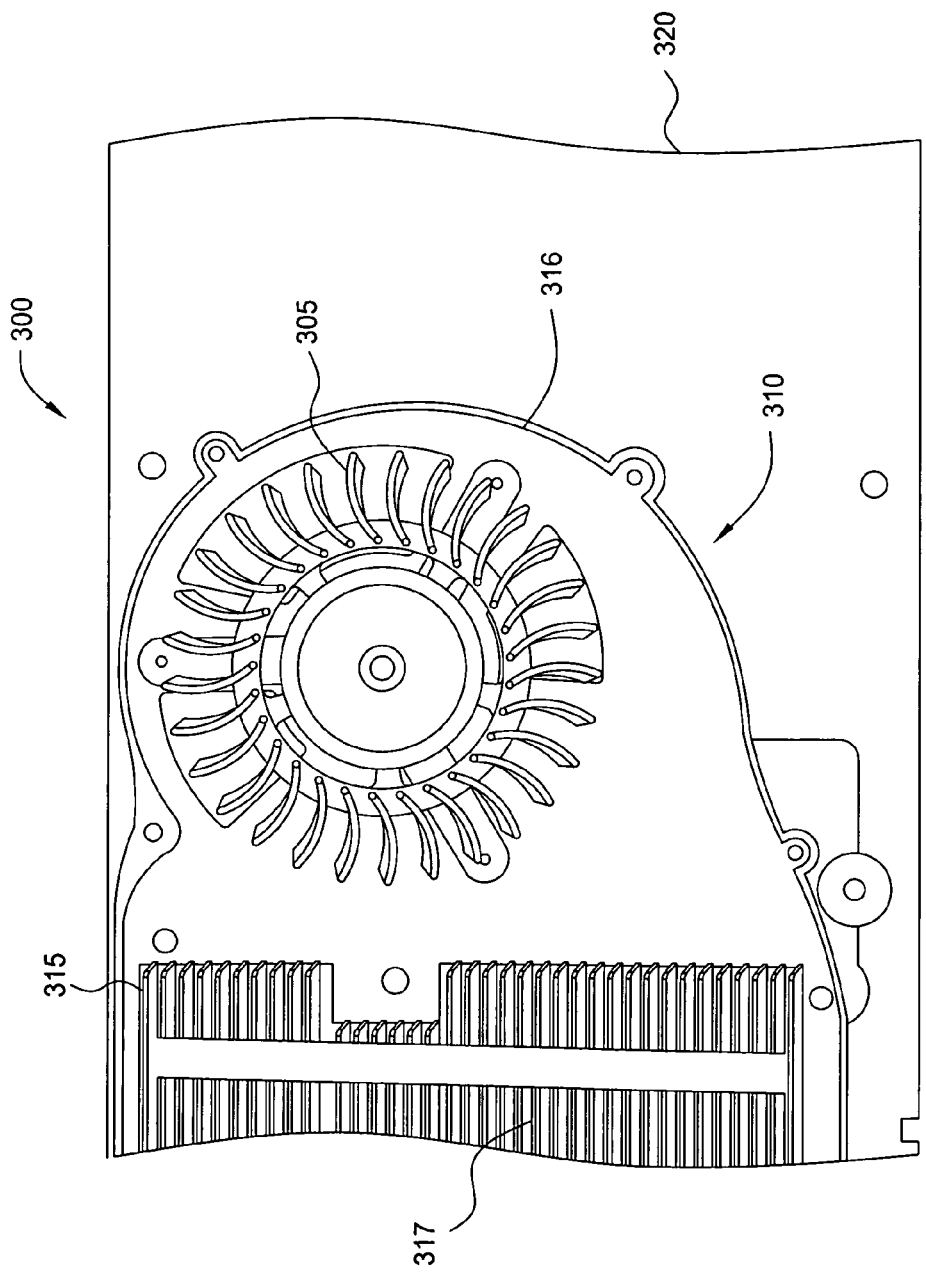
FIG. 3A is a top view of a cooling system for cooling a heat-generating electronic device, according to one embodiment of the present invention.

FIG. 3A illustrates a top view of a cooling system 300 for cooling a heat-generating electronic device, according to one embodiment of the present invention. As shown, cooling system 300 includes a PCB 320 and a fan assembly 310, which further includes a fan 305, fins 315 and a bottom plate 316. In one embodiment, fan 305 is a radial fan and is configured to blow air through air channels 317 formed in-part by fins 315 and bottom plate 316 to remove heat generated by heat-generating electronic device, such as a GPU. Similar to cooling system 100 of FIG. 1, air is able to enter fan assembly 310 through the top part of fan 305. However, as described in greater detail below in conjunction with FIG. 3B, PCB 320 includes one or more ventilation holes that enable a second inlet air flow path through fan assembly 310. This second inlet air flow path allows fan 305 to blow a greater volume of air through air channels 317, thereby increasing the cooling efficiency of cooling system 300 relative to prior art fansink cooling systems like cooling system 100 of FIG. 1.

Figure 3B:
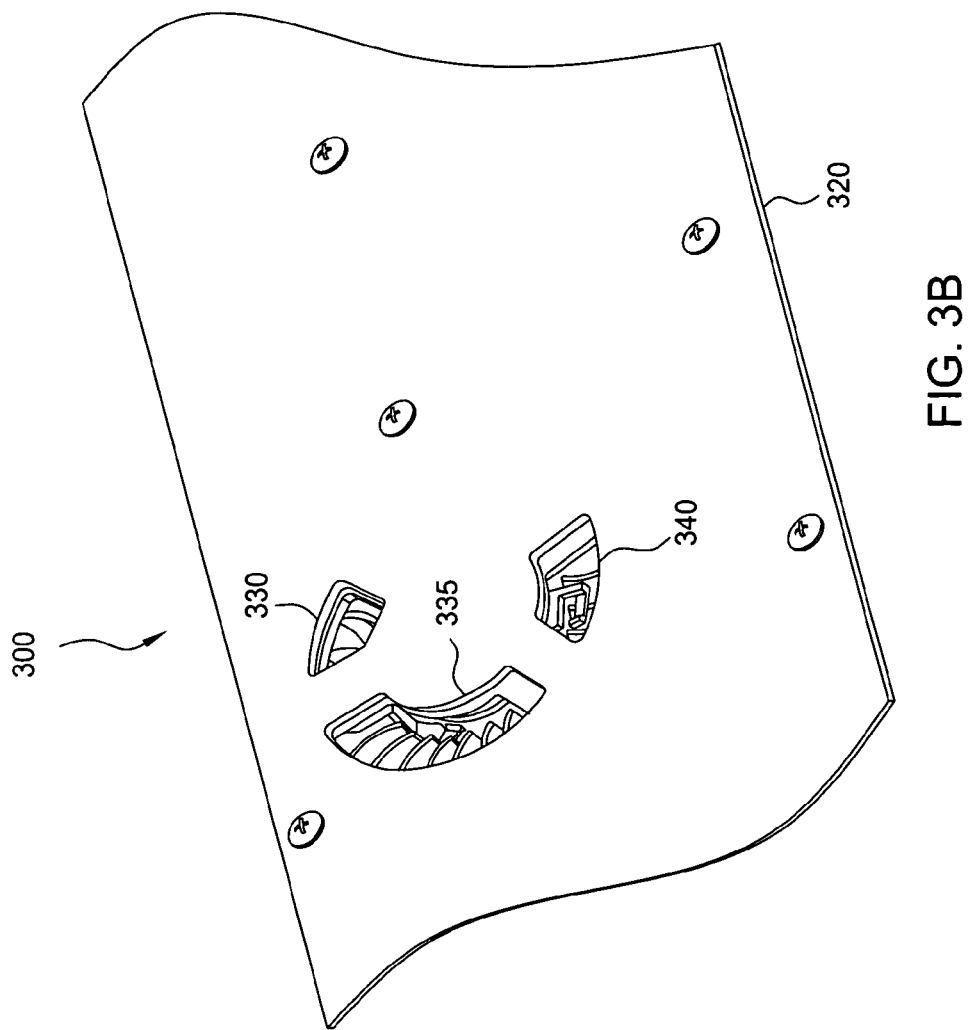
FIG. 3B is a bottom view of the cooling system of FIG. 3A, according to one embodiment of the present invention.

FIG. 3B illustrates a bottom view of cooling system 300 of FIG. 3A, according to one embodiment of the present invention. As shown, PCB 320 may include one or more ventilation holes 330, 335 and 340, which provide a second inlet air flow path through PCB 320 into fan assembly 310 (not shown). As previously described herein, with the second inlet air flow path, air is able to enter into fan assembly 310 through both the top of fan 305 and the bottom of fan 305, thereby increasing the volume of air that can be blown through the air channels 317. Ventilation holes 330, 335 and 340 may have any shape and may be placed at any location on PCB 320, so long as a second inlet air flow path can be established that enables air to reach the blades of fan 305. In the embodiment depicted in FIG. 3B, ventilation holes 330, 335 and 340 are substantially aligned with the circular path traversed by the blades of fan 305. Also, ventilation holes 330, 335 and 340 are preferably located on PCB 320 such that the positioning of the various electronic components coupled to PCB 320 is not interrupted.

Figure 4:
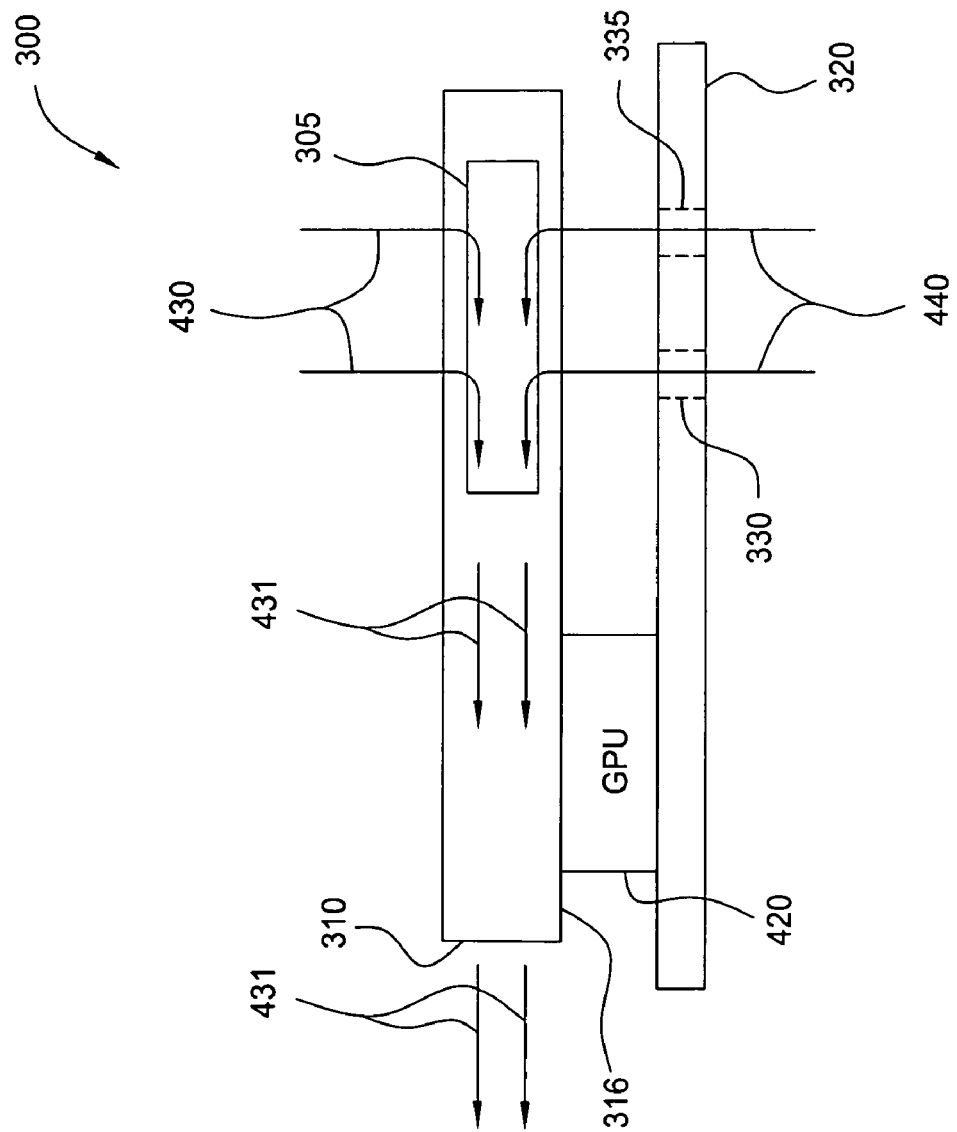
FIG. 4 is a side view of the cooling system of FIGS. 3A and 3B, depicting two inlet air flow paths through the cooling system during operation.

FIG. 4 illustrates a side view of cooling system 300 of FIGS. 3A and 3B, depicting two inlet air flow paths through cooling system 300 during operation. As shown, cooling system 300 is coupled to a GPU 420, which is mounted on printed PCB 320. During operation, air enters cooling system 300 through the top part of fan 305, as indicated by a first inlet air flow path 430, and through ventilation holes 330 and 335 and into the bottom part of fan 305, as indicated by a second inlet air flow path 440. Fan 305 forces this air through the air channels 317 (not shown) of fan assembly 310, as depicted by air flow lines 431. As previously described, the heat generated by GPU 420 transfers to the air as the air flows through air channels 317 and over bottom plate 316. The heated air is then dissipated into the external environment, thereby cooling GPU 420. Again, due to second inlet air flow path 440, fan 305 is able to blow a greater volume of air through air channels 317, thereby increasing the cooling efficiency of cooling system 300 relative to prior art cooling system 100, which provides only a single inlet air flow path. For example, experimental data has shown that a drop in operating temperature of about 10% results when a GPU operating at full power (approximately 75 Watts) is cooled using cooling system 300 instead of a cooling system similar to prior art cooling system 100.

Figure 5:
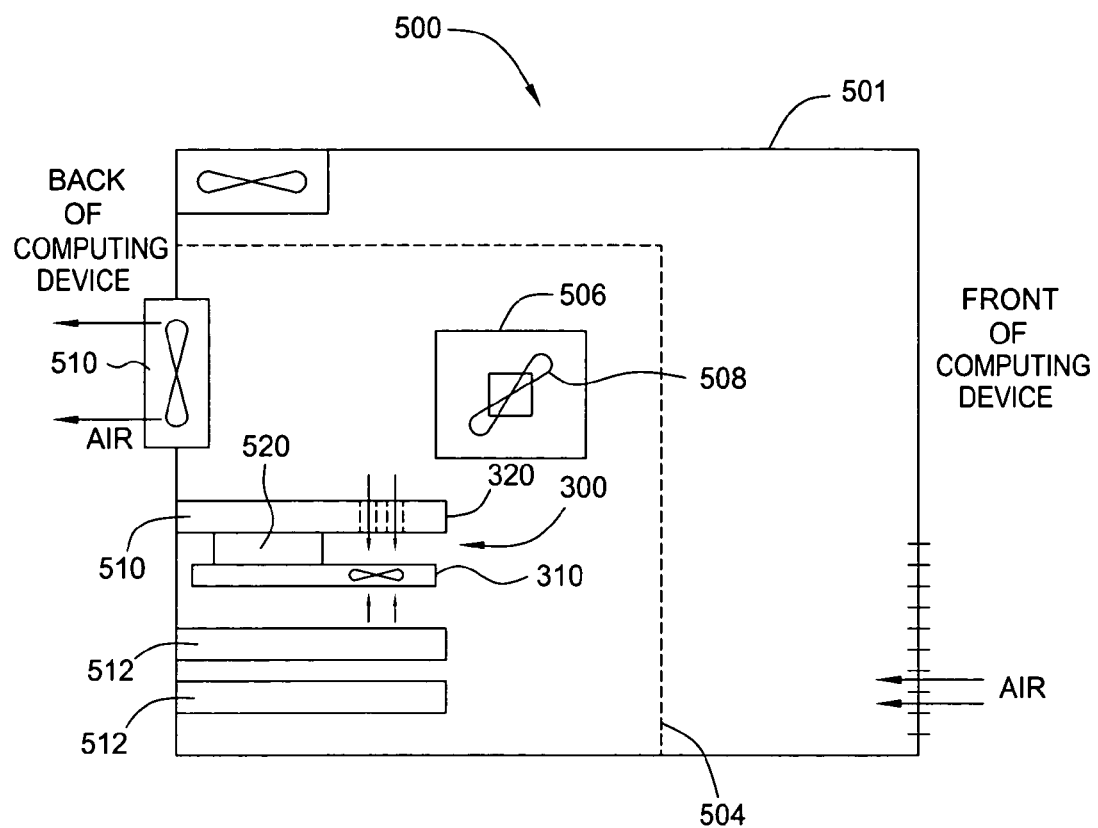
FIG. 5 is a computer system in which the cooling system of FIGS. 3A and 3B may be used for cooling one or more heat-generating electronic devices.

FIG. 5 illustrates a computer system 500 in which cooling system 300 of FIGS. 3A and 3B may be used for cooling one or more heat-generating electronic devices. Computer system 500 may be any type of computer system, such as a desktop, laptop, server, mainframe, set-top box, and the like, within which one or more heat-generating electronic devices reside. As shown, computer system 500 includes a housing 501 and a motherboard 504. A central processing unit (CPU) 506, a cooling system 508 for cooling CPU 506, a system fan 510 for removing heat from computer system 500, and one or more peripheral component interface (PCI) cards 512 are mounted on motherboard 504. Each PCI card 512 interfaces with a slot located in the back part of housing 501.

Motherboard 504 also incorporates a graphics card 510 that includes PCB 320, a GPU 520 mounted to PCB 320 and other electronic components also mounted to PCB 320. Graphics card 510 enables computing system 500 to rapidly process graphics related data for graphics-intensive applications, such as gaming, video processing and other similar applications. As also shown, cooling system 300 of FIGS. 3A and 3B is used to cool GPU 520 during operation. More specifically, fan assembly 310 is coupled to GPU 520 on a side opposite to PCB 320. Again, since PCB 320 includes one or more ventilation holes, there are two inlet air flow paths through fan assembly 310 instead of one, enabling more efficient cooling of GPU 520.

Persons skilled in the art will recognize that cooling system 300 may be used to cool any heat-generating electronic device within a computer system, including, without limitation, a semiconductor device such as GPU 520 or CPU 506, one or more memory chips, or any combination of these devices. Cooling system 300 also may be used to cool any type of power supply subsystem within a computer system. In addition, although cooling system 300 is described herein within the context of graphics cards, persons skilled in the art will understand that cooling system 300 may comprise the motherboard of a computer system, where the motherboard includes the one or more ventilation holes that enable the second inlet air flow path through fan assembly 310.

Although the embodiment disclosed above, which incorporates the teaching of the present invention, has been shown and described in detail herein, those skilled in the art can readily devise other varied embodiments which still incorporate the teachings and do not depart from the spirit of the invention.

We claim:

1. A system for cooling a heat-generating electronic device, the system consisting essentially of:
   a printed circuit board having a first plurality of ventilation holes and configured to be coupled to a first side of the heat-generating electronic device; and
   a fan assembly that includes:
      a fan having a top side and a bottom side, and
      a bottom plate having a first side, a second side and a second plurality of ventilation holes, wherein the first side of the bottom plate is coupled to the bottom side of the fan, the second side of the bottom plate is coupled to a second side of the heat-generating electronic device to create a gap between the bottom plate and the printed circuit board, and each of the second plurality of ventilation holes corresponds to a different one of the holes in the first plurality of ventilation holes in location and configuration to allow air to enter the bottom side of the fan through both the first and second pluralities of ventilation holes.

2. The system of claim 1, wherein the fan assembly includes at least one air channel, and the fan is configured to force air that enters into the top side of the fan assembly and into the bottom side of the fan assembly through the at least one channel.

3. The system of claim 2, wherein the fan is a radial fan.

4. The system of claim 2, wherein the first and second pluralities of ventilation holes are to be substantially aligned with a circular path traversed by blades of the fan during operation.

5. The system of claim 4, wherein the printed circuit board and the bottom plate each have three ventilation holes.

6. The system of claim 1, wherein the heat-generating electronic device is a graphics processing unit.

7. The system of claim 1, wherein the heat-generating electronic device is a central processing unit.

8. The system of claim 1, wherein the heat-generating electronic device is a memory chip.

9. A computer system configured with a cooling system, the computer system comprising:
   a heat-generating electronic device; and
   a cooling system, wherein the cooling system includes:
      a printed circuit board having a first plurality of ventilation holes and configured to be coupled to a first side of the heat-generating electronic device; and
      a fan assembly that includes:
         a fan having a top side and a bottom side, and
         a bottom plate having a first side, a second side and a second plurality of ventilation holes, wherein the first side of the bottom plate is coupled to the bottom side of the fan, the second side of the bottom plate is coupled to a second side of the heat-generating electronic device to create a gap between the bottom plate and the printed circuit board, and each of the second plurality of ventilation holes corresponds to a different one of the holes in the first plurality of ventilation holes in location and configuration to allow air to enter the bottom side of the fan through both the first and second pluralities of ventilation holes.

10. The computer system of claim 9, wherein the fan assembly includes at least one air channel, and the fan is configured to force air that enters into the top side of the fan assembly and into the bottom side of the fan assembly through the at least one channel.

11. The computer system of claim 10, wherein the fan is a radial fan.

12. The computer system of claim 10, wherein the first and second pluralities of ventilation holes are substantially aligned with a circular path traversed by blades of the fan during operation.

13. The computer system of claim 12, wherein the printed circuit board and the bottom plate each have three ventilation holes.

14. The computer system of claim 9, wherein the heat-generating electronic device is a graphics processing unit.

15. The computer system of claim 9, wherein the heat-generating electronic device is a central processing unit.

16. The computer system of claim 9, wherein the heat-generating electronic device is a memory chip.

17. The system of claim 1, further consisting essentially of one or more electronic components coupled to the printed circuit board and the bottom plate, wherein the first and second pluralities of ventilation holes are disposed on the printed circuit board and the bottom plate such that a typical positioning of the one or more electronic components is not interrupted.

18. The system of claim 9, further consisting essentially of one or more electronic components coupled to the printed circuit board and the bottom plate, wherein the first and second pluralities of ventilation holes are disposed on the printed circuit board and the bottom plate such that a typical positioning of the one or more electronic components is not interrupted.

19. The system of claim 6, wherein the first and second pluralities of ventilation holes are configured such that the air flow into the bottom side of the fan assembly through the first and second pluralities of ventilation holes decreases the operating temperature of the graphics processing unit by approximately 10% when the graphics processing unit is operating at full power.

20. The system of claim 14, wherein the first and second pluralities of ventilation holes are configured such that the air flow into the bottom side of the fan assembly through the first and second pluralities of ventilation holes decreases the operating temperature of the graphics processing unit by approximately 10% when the graphics processing unit is operating at full power.

21. The system of claim 4, wherein at least one ventilation hole is omitted from the substantially circular arrangement of the first plurality of ventilation holes, and wherein two ventilation holes having a first configuration are each disposed adjacent to the at least one omitted ventilation hole, and a third ventilation hole having a second configuration is disposed in between the two ventilation holes and opposite the at least one omitted hole on the substantially circular arrangement.

22. The system of claim 12, wherein at least one ventilation hole is omitted from the substantially circular arrangement of the first plurality of ventilation holes, and wherein two ventilation holes having a first configuration are each disposed adjacent to the at least one omitted ventilation hole, and a third ventilation hole having a second configuration is disposed in between the two ventilation holes and opposite the at least one omitted hole on the substantially circular arrangement.

* * * * *